(12) United States Patent
Lee

(10) Patent No.: US 7,327,175 B2
(45) Date of Patent: Feb. 5, 2008

(54) DELAY LOCKED LOOP CIRCUIT IN SEMICONDUCTOR DEVICE AND ITS CONTROL METHOD

(75) Inventor: Hyun-Woo Lee, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/319,719

(22) Filed: Dec. 29, 2005

(65) Prior Publication Data

US 2006/0192602 A1 Aug. 31, 2006

(30) Foreign Application Priority Data

Feb. 28, 2005 (KR) .................. 10-2005-0016760

(51) Int. Cl.
*H03L 7/06* (2006.01)
(52) U.S. Cl. .................... 327/158; 327/149
(58) Field of Classification Search .................. None
See application file for complete search history.

(56) References Cited

U.S. PATENT DOCUMENTS

| | | | | |
|---|---|---|---|---|
| 6,212,126 | B1* | 4/2001 | Sakamoto | 365/233 |
| 6,369,626 | B1 | 4/2002 | Donnelly et al. | |
| 6,417,715 | B2* | 7/2002 | Hamamoto et al. | 327/291 |
| 6,605,970 | B1* | 8/2003 | Keeth et al. | 327/159 |
| 6,664,830 | B2* | 12/2003 | Miller | 327/158 |
| 6,801,472 | B2* | 10/2004 | Lee | 365/233 |
| 6,809,990 | B2 | 10/2004 | Thomann et al. | |
| 6,819,626 | B2* | 11/2004 | Okuda et al. | 365/233 |
| 6,853,226 | B2 | 2/2005 | Kwak et al. | |
| 6,917,229 | B2* | 7/2005 | Cho | 327/158 |
| 6,943,602 | B1* | 9/2005 | Lee | 327/158 |
| 7,161,397 | B2* | 1/2007 | Lee et al. | 327/149 |
| 2004/0042257 | A1 | 3/2004 | Lee et al. | |

FOREIGN PATENT DOCUMENTS

| | | |
|---|---|---|
| JP | 2004-153792 | 5/2004 |
| JP | 2004-328456 | 11/2004 |
| KR | 10-2001-0113112 A | 12/2001 |
| KR | 10-2004-0046329 A | 6/2004 |

* cited by examiner

*Primary Examiner*—Cassandra Cox
(74) *Attorney, Agent, or Firm*—McDermott Will & Emery LLP

(57) ABSTRACT

A delay locked loop (DLL) device includes a first and a second input buffers for receiving an external clock, a multiplexer for selectively outputting a first and a second internal clocks based on a most significant bit (MSB) signal, a delay means for delaying the first and the second internal clock which is selected by the multiplexer, a phase detector for comparing a phase of the first internal clock with that of a feedback clock which is feedbacked from the delay means to thereby output a comparing signal, a low pass filter (LPF) mode generator for outputting a locking signal, which checks a locking state of the feedback clock based on the comparing signal and a first and a second control signals, to the delay means, and a low pass filter for receiving the comparing signal to inform whether or not the comparing signal is erroneous to the delay means.

16 Claims, 5 Drawing Sheets

DELAY LOCKED LOOP CIRCUIT IN SEMICONDUCTOR DEVICE AND ITS CONTROL METHOD

FIELD OF THE INVENTION

The present invention relates to a delay locked loop (DLL) device; and, more particularly, to a DLL device including a mode generator with a low pass filter for preventing a clock stuck, i.e., a state that a phase of a clock is stuck and not properly moved.

DESCRIPTION OF RELATED ARTS

A clock is used as a reference for adjusting a driving time and supporting a high speed operation without any error in a system or a circuit. When an external clock is used in an internal circuit, a clock skew occurs when passing through blocks in the internal circuit. A delay locked loop (DLL) device is used for compensating the clock skew. That is, the DLL device synchronizes an output data with the external clock.

FIG. 1 is a block diagram describing a conventional DLL device.

As shown, the conventional DLL device comprises an input buffer 10, a first coarse delay line 20, a second coarse delay line 30, a fine delay 40, a delay replica 50, a phase detector 60, a mode generator 70, a low path filter 80, and a shift register 90.

The input buffer 10 receives an external clock CLK_E and an inverted external clock CLK_EB to thereby output an internal clock CLK_I. The internal clock CLK_I is inputted to the first and second coarse delay lines 20 and 30.

The first and second coarse delay lines 20 and 30 includes a plurality of unit delay cells (UDC) serially connected one another. The number of the UDCs included in the first coarse delay line 20 is less than a number of the UDCs included in the second coarse delay line 30 by 1. In other words, if the number of the UDCs included in the first coarse delay line 20 is N, the number of the UDCs included in the second coarse delay line 30 is N+1. Herein, N is a positive integer.

The fine delay line 40 controls a delay length, i.e., an amount of delay, by mixing first and second delay clocks CLK_ID1 and CLK_ID2 outputted from the first and second coarse delay lines 20 and 30, respectively, in response to an output signal outputted from the shift register 90.

The delay replica 50 receives an output from the fine delay line 40 and compensates a clock skew, i.e., an amount of a delay occurred to the external clock CLK_E, to thereby output a feedback clock CLK_FB.

The phase detector 60 compares a phase of the internal clock CLK_I with a phase of the feedback clock CLK_FB to thereby output a phase difference.

The mode generator 70 outputs coarse compensation commands to the first and the second coarse delay lines 20 and 30 when the phase difference outputted from the phase detector 60 is greater than a predetermined value. Further, when the phase difference is smaller than the predetermined value, the mode generator 70 outputs a fine compensation command to the fine delay line 40 to thereby compensate the phase of the internal clock CLK_I.

The low pass filter 80 filters the phase difference outputted from the phase detector 60. That is, the low pass filter 80 compares the predetermined numbers of the phase difference to thereby detect whether the phase difference has a noise. For example, if the predetermined numbers of the phase differences are the same, the low pass filter 80 outputs a delay command to the shift register 90. On the contrary, if at least one of the predetermined numbers the phase differences is different from the others, the low pass filter 80 considers that noise exists and, therefore, output an invalid command.

FIG. 2 is a schematic circuit diagram depicting the fine delay 40 shown in FIG. 1.

As shown, the fine delay 40 includes a first clock delayer 41 and a second clock delayer 42. The first and the second clock delayers 41 and 42 have the same number of inverters parallel connected one another. For example, if the first clock delayer 41 includes eight inverters, the second clock delayer 42 also includes eight inverters. Each of the inverters in the fine delay is controlled by the output signal from the shift register 90. The output signal from the shift register 90 determines a coefficient K of the fine delay line 40.

When the coefficient K is determined to be '1' in response to the output signal from the shift register 90, a first delay clock CLK_ID1 outputted from the first coarse delay line 20 is outputted without any alteration. Meanwhile, when the phase detector 60 determines that the phase of the feedback clock CLK_FB precedes the phase of the internal clock CLK_I, the coefficient K of the fine delay line 40 is decreased. As the coefficient K of the fine delay line 40 approaches to '0', the fine delay line 40 outputs a signal more approximated to a second delay clock CLK_ID2 outputted from the second coarse delay line 30. When the coefficient K becomes '0', the fine delay line 40 outputs the second delay clock CLK_ID2 without any alteration.

However, if the phase detector 60 detects that the phase of the feedback clock CLK_FB precedes the phase of the internal clock CLK_I, although the coefficient K is '0', the fine delay line 40 makes the first coarse delay line 20 perform a shift left operation. For example, by performing the shift left operation, the first coarse delay line 20 outputs the first delay clock CLK_ID1 by using five UDCs instead of using three UDCs. Herein, since the coefficient K is still '0', only the second delay clock CLK_ID2 is outputted from the fine delay line 40 and, therefore, a change of delay generated by the first coarse delay line 20 does not affect to the output of the fine delay line 40.

As mentioned above, if it is required to delay the feedback clock CLK_FB after the shift left operation is performed in the first coarse delay line 20, the feedback clock CLK_FB is delayed by increasing the coefficient K of the fine delay line 40. As the coefficient K is increased, the phase of the output from the fine delay line 40 approximates from the phase of the second delay clock CLK_ID2 to the phase of the first delay clock CLK_ID1.

Meanwhile, when it is required to decrease the delay of the feedback clock CLK_FB, the conventional DLL performs the abovementioned methods in opposite direction.

The mode generator 70 of the conventional DLL device does not provides a filtering operation. Therefore, when a jitter occurs to the external clock CLK_E, the conventional DLL device considers that the feedback clock CLK_E is in a lock state. For example, although the phase of the external clock CLK_E leads the phase of the feedback clock CLK_FB continuously, the conventional DLL device considers that the phase of the external clock CLK_E firstly lags behind the phase of the feedback clock CLK_FB; and, then, leads the phase of the feedback clock CLK_FB.

FIGS. 3A and 3B are timing diagrams showing a phase relationship between the external clock CLK_E and the feedback clock CLK_FB.

FIG. 3A shows the phase relationship in a previous stage of the conventional DLL, and FIG. 3B shows the phase relationship in a next stage of the conventional DLL.

Referring to FIG. 3A, at the previous stage, the conventional DLL detects a level of the external clock CLK_E as 'L' at a rising edge of the feedback clock CLK_FB. Further, referring to FIG. 3B, at the next stage, the DLL device detects the level of the external clock CLK_E as 'H' at the rising edge of the feedback clock CLK_FB. That is, the DLL device determines that the level of the external clock CLK_E is changed from 'L' to 'H'. As a result, a clock stuck results. In other words, the conventional DLL treats jittering as a locking state. Consequently, the conventional DLL performs a fine delay operation through the fine delay line 40 instead of the coarse delay operation and, therefore, in such situations, the DLL does not provide a sufficient delay and cannot perform a stable operation.

SUMMARY OF THE INVENTION

It is, therefore, an object of the present invention to provide a DLL device saving an advantage of overcoming a jitter and preventing a clock stuck by using a mode generator with a low pass filter.

It is another object of the present invention to provide the DLL device for reducing a delay amount by using a multiplexer.

In accordance with an aspect of the present invention, there is provided a delay locked loop (DLL) device including: a first and a second input buffers for receiving an external clock to thereby respectively output a first and a second internal clocks; a multiplexer for selectively outputting the first and the second internal clocks based on a most significant bit (MSB) signal; a delay means for delaying the first and the second internal clock which is selected by the multiplexer; a phase detector for comparing a phase of the first internal clock with that of a feedback clock which is feedbacked from the delay means to thereby output a comparing signal; a low pass filter (LPF) mode generator for outputting a locking signal, which checks a locking state of the feedback clock based on the comparing signal and a first and a second control signals, to the delay means; and a low pass filter for receiving the comparing signal to inform whether or not the comparing signal is erroneous to the delay means.

In accordance with another aspect of the present invention, there is provided a control method for a delay locked loop (DLL) device including the steps of: receiving an external clock to thereby respectively output a first and a second internal clocks; selectively outputting the first and the second internal clocks based on a most significant bit (MSB) signal; delaying the first and the second internal clock which is selected by the multiplexer; comparing a phase of the first internal clock with that of a feedback clock which is feedbacked from the delay means to thereby output a comparing signal; outputting a locking signal, which checks a locking state of the feedback clock based on the comparing signal and a first and a second control signals, to the delay means; and receiving the comparing signal to inform whether or not the comparing signal is erroneous to the delay means.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a delay locked loop (DLL) device in accordance with the present invention will be described in detail referring to the accompanying drawings.

Figure 1:
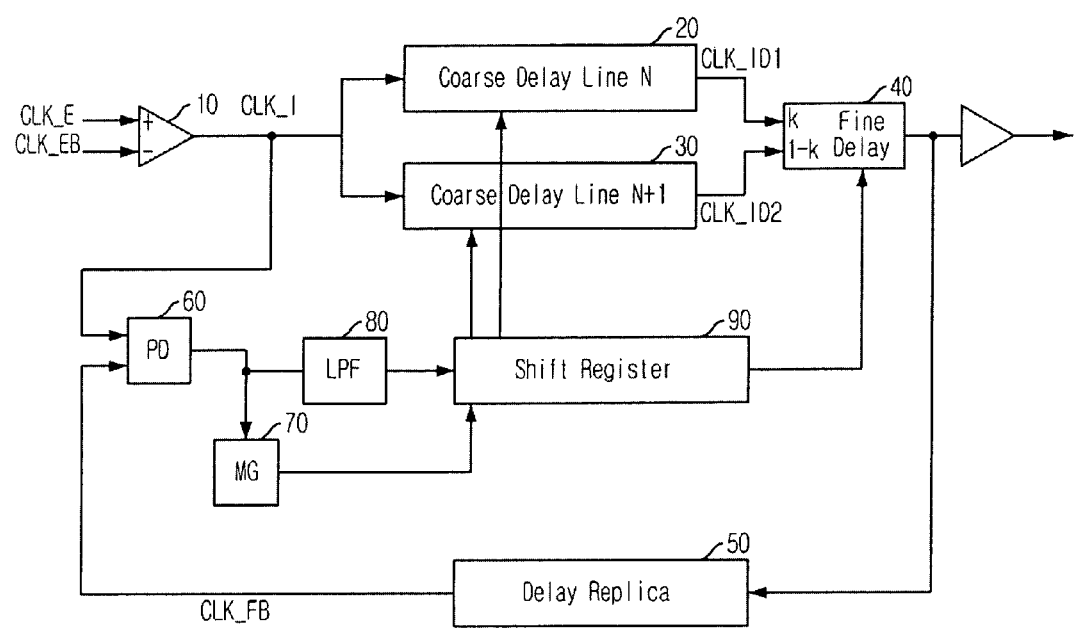
FIG. 1 is a block diagram describing a conventional delay locked loop (DLL) device.
Figure 2:
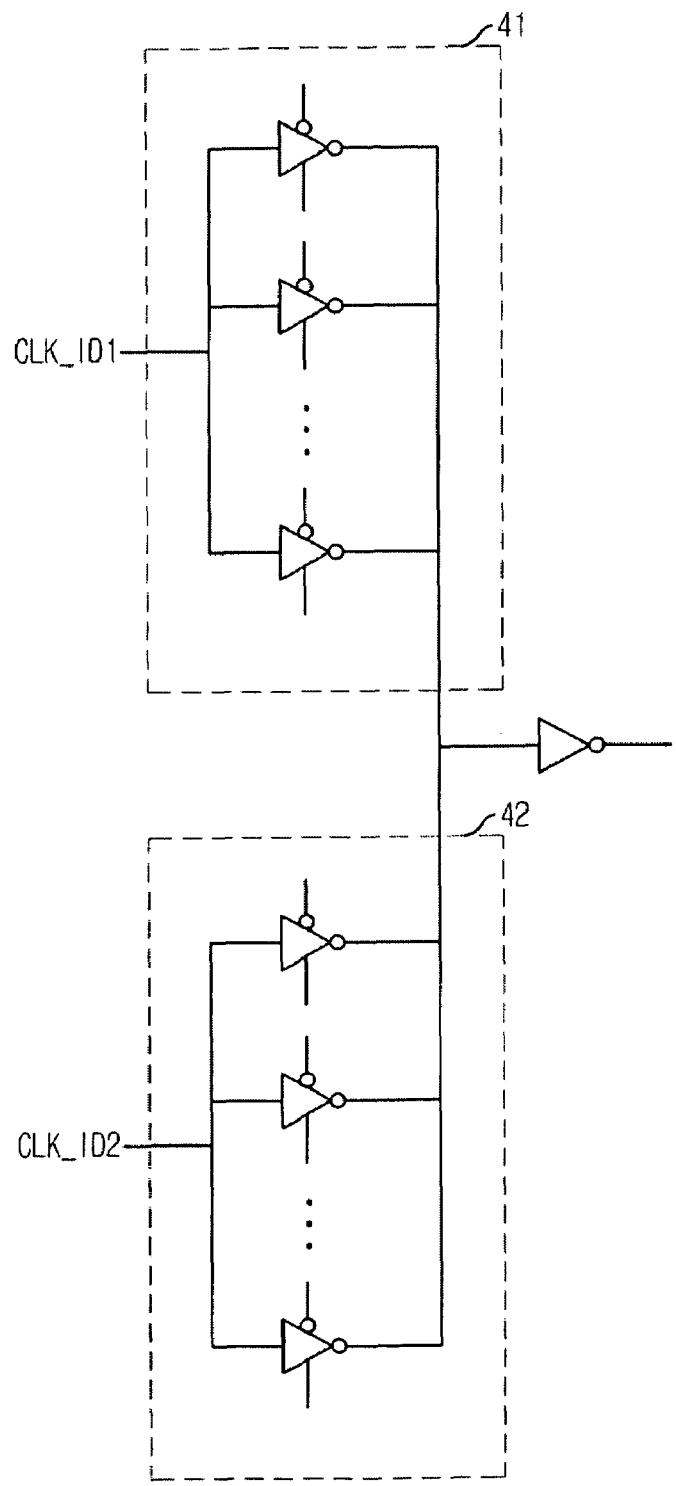
FIG. 2 is a schematic circuit diagram depicting a fine delay shown in FIG. 1.
Figure 3A:
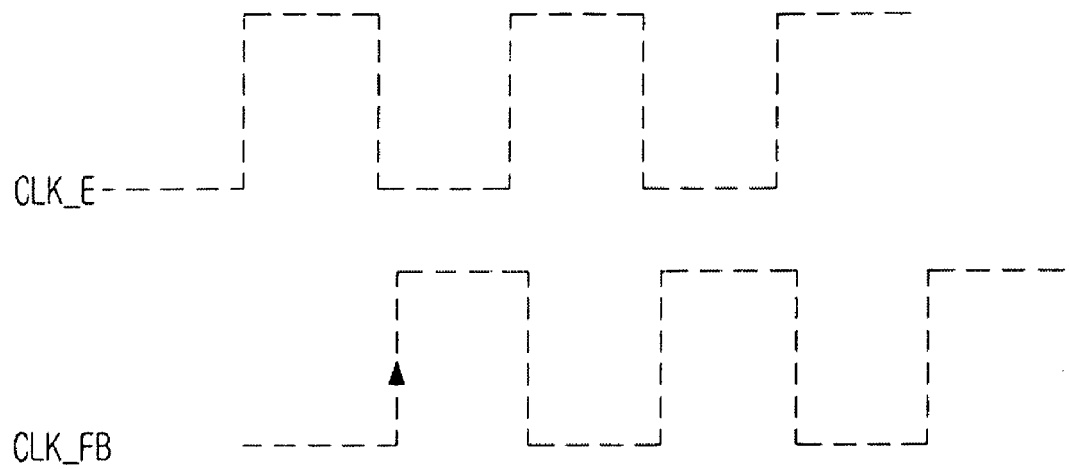
FIGS. 3A and 3B are timing diagrams showing a phase relationship between an external clock and a feedback clock.
Figure 3B:
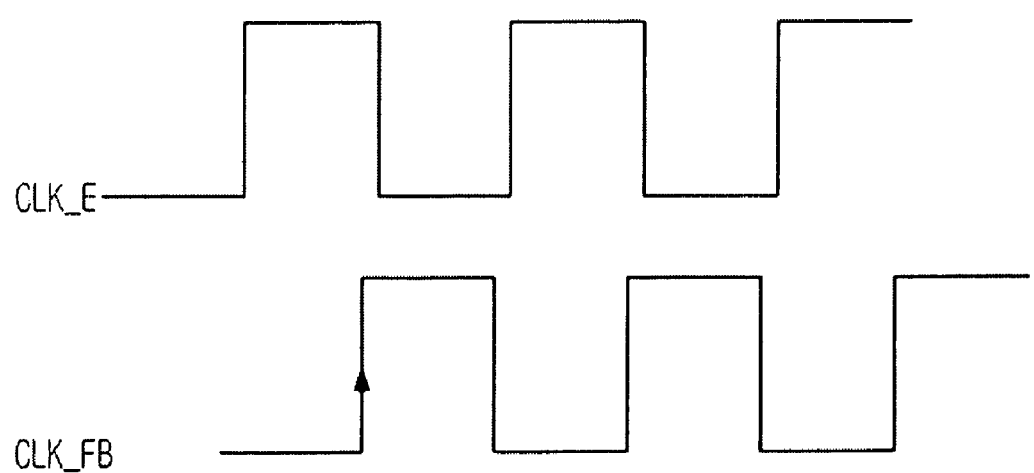
Figure 4:
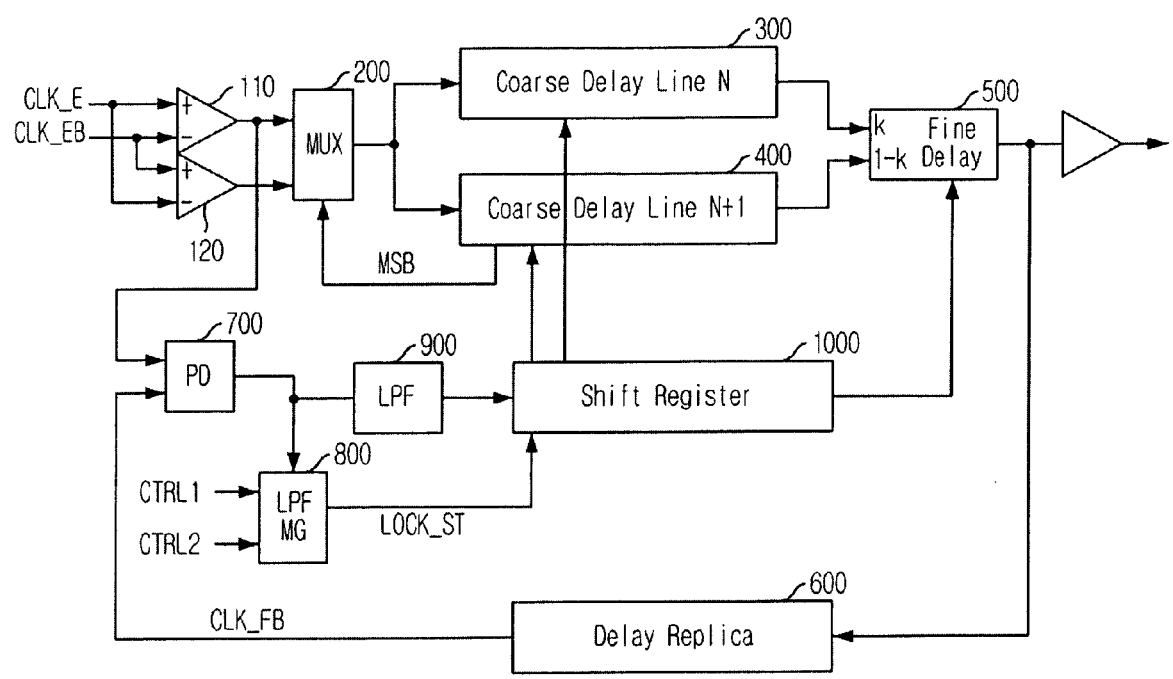
FIG. 4 is a block diagram describing a DDL device in accordance with an embodiment of the present invention.

FIG. 4 is a block diagram describing a DDL device in accordance with an embodiment of the present invention.

As shown, the DLL device according to the present invention comprises two input buffers, i.e., a first input buffer 110 and a second input buffer 120, a multiplexer 200, first and second coarse delay lines 300 and 400, a fine delay line 500, a delay replica 600, a phase detector 700, a mode generator 800, a low pass filtering block 900, and a shift register 1000.

Compared with the conventional DLL device, the DLL device according to the present invention includes two input buffers 110 and 120, and a multiplexer (MUX) 200. Further, the first and the second coarse delay lines 300 and 400 are implemented using one half of unit delay cells (UDC) compared with those used in the conventional DLL, and the mode generator 800 includes a low pass filter. Other elements such as a fine delay line 500, a delay replica 600, a phase detector 700, a low pass filtering block 900, and a shift register 1000 are similar to those in the conventional DLL. The elements similar to the conventional DLL are not explained hereinafter.

The first input buffer 110 outputs a first internal clock CLK_I1 having a same phase with an external clock CLK_E. The second input buffer 120 outputs a second internal clock CLk_I2 having an inversed phase with the external clock CLK_E. The MUX 200 outputs one of the first and second internal clocks CLK_I1 and CLK_I2 in response to a most significant bit (MSB) signal outputted from the second coarse delay line 400.

The MSB signal is outputted when an additional delay is required after the first and second coarse delay lines 300 and 400 perform a delay operation to maximum values, respectively. After receiving the MSB signal, the MUX 200 converts the output clock. For example, if the MUX 200 outputs the first internal clock CLK_I1 before the MSB signal is inputted, the MUX 200 outputs the second internal clock CLk_I2 after the MSB signal is inputted. Therefore, it is possible for the first and second coarse delay lines 300 and 400 to deploy about one half of the UDCs, as compared with the conventional art. In other words, a delay length of each of the coarse delay lines 300 and 400 can be about one half of a minimum driving frequency.

Meanwhile, the mode generator 800 decreases a noise of the external clock CLK_E by using the low pass filter.

Figure 5:
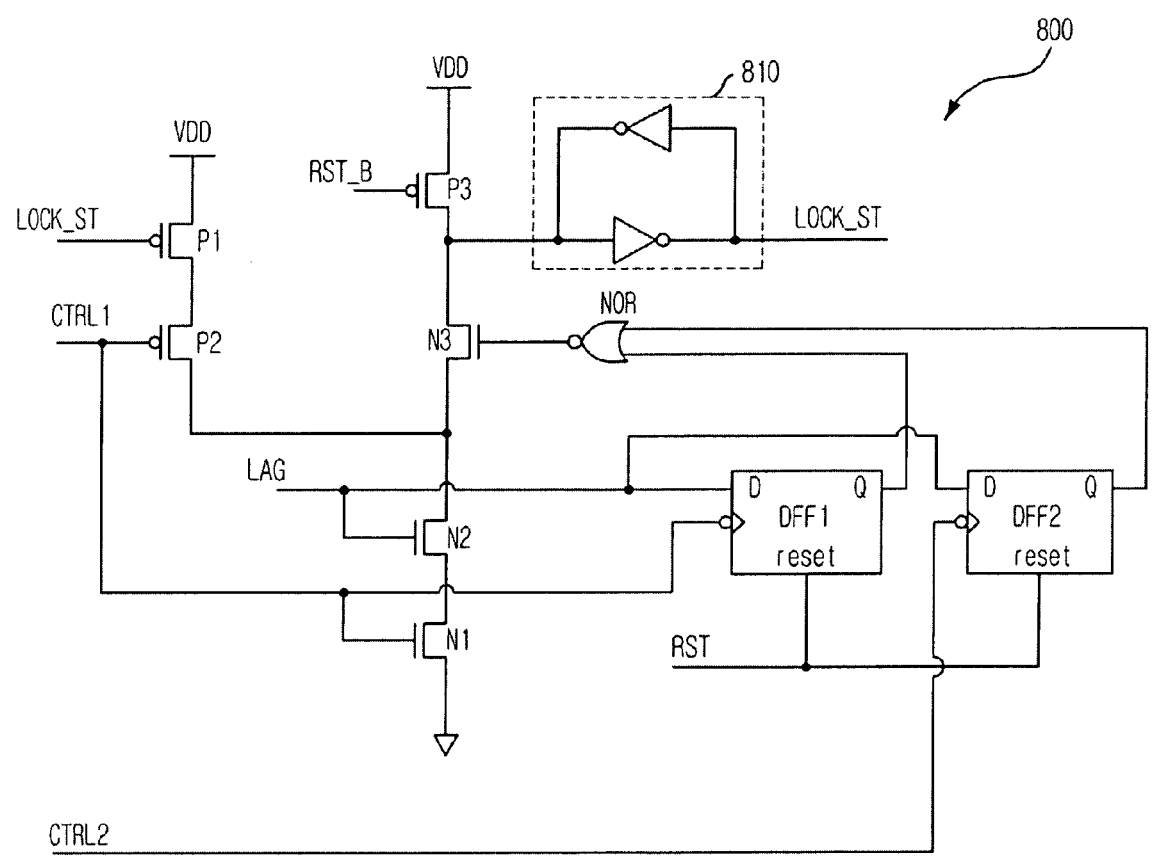
FIG. 5 is a schematic circuit diagram depicting a mode generator with a low pass filter.

FIG. 5 is a schematic circuit diagram depicting the mode generator 800 with the low pass filter shown in FIG. 4.

As shown, the mode generator 800 with the low pass filter comprises first and second D flip-flops DFF1 and DFF2, a NOR gate NOR, a first to a third NMOS transistor N1, N2, and N3, a first to a third PMOS transistors P1, P2, and P3, and a latch 810.

The first D flip-flop DFF1 receives a first control signal CTRL1 through a clock terminal and a comparing signal LAG through a data terminal. The second D flip-flop DFF2 receives a second control signal CTRL2 through a clock terminal and the comparing signal LAG through a data terminal. The NOR gate NOR receives outputs from the first and second D flip-flops DFF1 and DFF2. The first NMOS transistor N1 is controlled by the first control signal CTRL1. The second NMOS transistor N2 is controlled by the comparing signal LAG and is serially connected to the first NMOS transistor N1. The third NMOS transistor N3 is controlled by an output of the NOR gate NOR and is serially connected to the second NMOS transistor N2. The third PMOS transistor P3 controlled by an inverted reset signal RST_B is connected between the third NMOS transistor N3 and a power supply voltage VDD. The latch 810 connected to a drain of the third NMOS transistor N3 outputs a locking signal LOCK_ST.

Herein, the inverted reset signal RST_B is generated by inverting a reset signal for resetting the first and second D flip-flops DFF1 and DFF2. In this embodiment, the first control signal CTRL1 is enabled once at every 20 cycles of the external clock CLK_E. The first control signal CTRL1 is inputted to the first NMOS transistor N1, a first D flip-flop DFF1, and the second PMOS transistor P2. The second control signal CTRL2, enabled once at every 20 cycles of the external clock CLK_E, lags behind the first control signal CTRL1 by two clocks. The first and second control signals CTRL1 and CTRL2 are generated by dividing the external clock CLK_E. A level of the comparing signal LAG is determined by that of the external clock CLK_E at a rising edge of a feedback clock CLK_FB. That is, if the level of the external clock CLK_E is a logic level 'L' at the rising edge of the feedback clock CLK_FB, the comparing signal LAG is outputted as a logic level 'L', and vice versa.

Hereinafter, an operation of the mode generator 800 with the low pass filter is explained in detail.

First, when the external clock CLK_E is not in the lock state, the locking signal LOCK_ST holds a logic level 'L'. If the locking signal LOCK_ST and the first control signal CTRL1 have a logic level 'L', the first and second PMOS transistors P1 and P2 are turned-on and the first NMOS transistor N1 is turned-off.

If the level of the external clock CLK_E at the rising edge of the feedback clock CLK_FB is logic level 'L', the comparing signal having a logic level 'L' is inputted to the first and second D flip-flops DFF1 and DFF2. Though the second control signal CTRL2 is inputted to the second D flip-flop DFF2, the first and second D flip-flops DFF1 and DFF2 outputs the logic level 'L' if the comparing signal holds the logic level 'L'. Receiving two logic inputs having a level 'L', the NOR gate NOR outputs a logic level 'H'. Herein, the comparing signal LAG still holds the logic level 'L', the second NMOS transistor N2 is turned-off.

Then, if the level of the external clock CLK_E at the rising clock of the feedback clock CLK_FB becomes a logic level 'H', the logic level of the comparing signal LAG becomes 'H'. Accordingly, the second NMOS transistor N2 is turned-on, and a ground voltage is inputted to the latch 810. The latch 810 outputs the locking signal LOCK_ST having a logic level 'H'.

That is, when the external clock CLK_E changes the logic level 'L' to the logic level 'H', the DLL device considers that the feedback clock is entered to the locking state. Consequently, the shift register outputs a command for diverting from a coarse delay operation by the first and second coarse delay lines 300 and 400 to a fine delay operation performed by the fine delay line 500.

In another embodiment, the present invention may include more than three D flip-flops in the mode generator in order to more sufficiently eliminate the jittering of the external clock CLK_E. In this case, a third control signal enabled later than the second control signal CTRL2 is required.

By including the low pass filter in the mode generator 800, the present invention expands a locking range of the DLL device. By reducing the number of the UDCs used in the coarse delay lines 300 and 400, both the chip size and power consumption can be reduced. The DDL device of the present invention sufficiently protects against jittering of the external clock CLK_E. Further, the DLL device according to the present invention operates reliably by using a relatively low driving frequency.

The present application contains subject matter related to Korean patent application No. 2005-16760, filed in the Korean Patent Office on Feb. 28, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A delay locked loop (DLL) device, comprising:
a first input buffer and a second input buffer for receiving an external clock to thereby respectively output a first internal clock and a second internal clock;
a multiplexer for selectively outputting the first or the second internal clock based on a most significant bit (MSB) signal;
a delay means for delaying the first or the second internal clock selected by the multiplexer;
a phase detector for comparing the phase of the first internal clock with that of a feedback clock which is fed back from the delay means to thereby output a comparing signal;
a mode generator for outputting a locking signal, which indicates a lock state of the feedback clock based on the comparing signal and a first and a second control signal; and
a unit for outputting a delay control signal to the delay means in response to the comparing signal and the locking signal.

2. The DLL device as recited in claim 1, wherein the first internal clock has the same phase as the external clock and the second internal clock has an inverted phase of the external clock.

3. The DLL device as recited in claim 2, further comprising a delay replica for receiving an output if the delay means to thereby output the feedback clock.

4. The DLL device as recited in claim 2, wherein the mode generator outputs the locking signal when a level of the comparing signal is changed from a first logic level to a second logic level.

5. The DLL device as recited in claim 2, wherein the second control signal lags behind the first control signal by a predetermined number of the external clock cycles.

6. The DLL device as recited in claim 2, wherein the delay means includes:
   a first coarse delay line, comprising N unit delay cells (UDC);
   a second coarse delay line, comprising (N+1) UDCs;
   a fine delay line for mixing outputs of the first and the second coarse delay line in response to the delay control signal
   wherein N is positive integer,
   wherein the first course delay line and the second course delay line each delay the internal clock selected by the multiplexer.

7. The DLL device as recited in claim 6, wherein the MSB signal is outputted from the second course delay line to thereby control the multiplexer.

8. The DLL device as recited in claim 4, wherein the mode generator includes:
   a first D flip-flop receiving the first control signal through a clock terminal and the comparing signal through a data terminal;
   a second D flip-flop receiving the second control signal through a clock terminal and the comparing signal through a data terminal;
   a NOR gate receiving outputs from the first and second D flip-flops as inputs;
   a first NMOS transistor controlled by the first control signal;
   a second NMOS transistor controlled by the comparing signal and serially connected to the first NMOS transistor;
   a third NMOS transistor controlled by an output from the NOR gate and serially connected to the second NMOS transistor;
   a PMOS transistor serially connected between a power supply voltage and the third NMOS transistor and controlled by an inverted reset signal generated by inverting a reset signal for resetting the first and second D flip-flops; and
   a latch connected to a drain of the third NMOS transistor for outputting the locking signal.

9. A control method for a delay locked loop (DLL) device having a delay means, comprising the steps of:
   receiving an eternal clock to thereby respectively output a first and a second internal clock;
   selectively outputting the first or the second internal clock based on a most significant bit (MSB) signal;
   delaying the first or the second internal clock selected by the multiplexer;
   comparing the phase of the first internal clock with that of a feedback clock which is fed back from the delay means to thereby output a comparing signal;
   outputting a locking signal, indicating a lock state of the feedback clock based on the comparing signal and a first and a second control signal; and
   generating a delay control signal to the delay means in response to the locking signal and the comparing signal.

10. The control method as recited in claim 9, wherein the first internal clock has the same phase with the external clock and the second internal clock has an inverted phase of the external clock.

11. The control method as recited in claim 10, further comprising receiving an output of the delay means to thereby output the feedback clock.

12. The control method as recited in claim 10, wherein the locking signal is activated when a level of the comparing signal is changed from a first logic level to a second logic level.

13. The control method as recited in claim 10, wherein the second control signal lags behind the first control signal by a predetermined number of the external clock cycles.

14. A delay locked loop (DLL) device, comprising:
   a first input buffer and a second input buffer for receiving an external clock to thereby respectively output a first internal clock and a second internal clock;
   a multiplexer for selectively outputting the first or the second internal clock based on a most significant bit (MSB) signal;
   a delay means for delaying the first or the second internal clock selected by the multiplexer;
   a phase detector for comparing the phase of the first internal clock with that of a feedback clock which is fed back from the delay means to thereby output a comparing signal;
   a mode generator for outputting a locking signal, which indicates a lock state of the feedback clock based on the comparing signal and a first and a second control signal, to the delay means, and
   a filtering block for comparing a predetermined number of phases of the comparing signal and selectively outputting delay command and an invalid command according to the comparison result to the delay means, wherein the predetermined number of phases are obtained by delaying the comparing signal with different delay amounts.

15. The DLL device of claim 14, wherein the filtering block outputs the delay command when the phases have the same states and the invalid command when at least one of the phases has a different state from the others.

16. The DLL device of claim 15, wherein the delay means includes:
   a first coarse delay line, comprising N unit delay cells (UDC), N being a positive integer,
   a second coarse delay line, comprising (N+1) UDCs;
   a fine delay line for mixing outputs of the first and the second coarse delay lines in response to a delay control signal; and
   a shift register for outputting the delay control signal based on the locking signal and the delay command or the invalid command outputted from the filtering block, wherein N is a positive integer,
   wherein the first coarse delay line and the second coarse delay line each delay the internal clock selected by the multiplexer.

* * * * *